(12) United States Patent
Dicke et al.

(10) Patent No.: US 9,787,314 B2
(45) Date of Patent: Oct. 10, 2017

(54) SYSTEM AND METHOD FOR FAST-CAPTURE MULTI-GAIN PHASE LOCK LOOP

(71) Applicant: Treehouse Design, Inc., Colorado Springs, CO (US)

(72) Inventors: Curtis J. Dicke, Colorado Springs, CO (US); Glenn E. Noufer, Manitou Springs, CO (US)

(73) Assignee: Treehouse Design, Inc., Colorado Springs, CO (US)

( * ) Notice: Subject to any disclaimer, the term of this patent is extended or adjusted under 35 U.S.C. 154(b) by 18 days.

(21) Appl. No.: 15/014,907

(22) Filed: Feb. 3, 2016

(65) Prior Publication Data

US 2016/0226501 A1    Aug. 4, 2016

Related U.S. Application Data

(60) Provisional application No. 62/111,542, filed on Feb. 3, 2015.

(51) Int. Cl.
| | | |
|---|---|---|
| *H03K 3/03* | (2006.01) | |
| *H03L 7/099* | (2006.01) | |
| *H03B 27/00* | (2006.01) | |
| *H03L 7/10* | (2006.01) | |

(52) U.S. Cl.
CPC ........... *H03L 7/0995* (2013.01); *H03B 27/00* (2013.01); *H03K 3/0315* (2013.01); *H03L 7/099* (2013.01); *H03L 7/10* (2013.01)

(58) Field of Classification Search
CPC ......... H03L 7/099; H03L 7/0995; H03L 7/10; G11C 11/4076; H03B 27/00; H03K 3/0315
USPC ............................... 331/57, 16, 34; 327/156
See application file for complete search history.

(56) References Cited

U.S. PATENT DOCUMENTS

| | | | |
|---|---|---|---|
| 8,878,614 B2 * | 11/2014 | Yin ......................... | H03L 7/099 327/147 |
| 2002/0021179 A1 * | 2/2002 | Ooishi ................ | G11C 11/4076 331/57 |

\* cited by examiner

*Primary Examiner* — Arnold Kinkead
(74) *Attorney, Agent, or Firm* — Lathrop & Gage LLP

(57) ABSTRACT

A phase locked loop system has a voltage-controlled variable-load ring oscillator (VLCO) that operates in a frequency band determined by a selected load on each stage of the ring oscillator. Each stage of the VLCO has multiple load selection transistors, each coupled to a load capacitor. Apparatus is provided for driving the load selection transistors according to a load configuration; and apparatus is provided for determining an operating load configuration such that a period of a divided reference signal approximately matches a period of a divided VLCO signal with the VLCO control voltage input clamped to a reference voltage. Once the load configuration is set, the loop is allowed to lock. In a particular embodiment, devices are provided for slowly tweaking the VLCO load to help keep the VLCO operating near an optimum control voltage despite drift of circuit parameters with temperature or time.

10 Claims, 6 Drawing Sheets

SYSTEM AND METHOD FOR FAST-CAPTURE MULTI-GAIN PHASE LOCK LOOP

CROSS-REFERENCE TO RELATED APPLICATIONS

The present application claims priority to U.S. Provisional Patent Application 62/111,542 filed 3 Feb. 2015, the contents of which are incorporated herein by reference.

FIELD

The present document relates to fast-capture phase-locked loops.

BACKGROUND

Phase-locked loops and frequency synthesis devices using phase-locked loops are widespread throughout the electronic industry. In general, a phase-locked synthesis device has the following portions:

An optional input divider that receives a reference signal and gives a divided reference;

A phase detector that provides a difference signal between the divided reference and a feedback signal;

A low-pass filter on an output of the phase detector;

A voltage or current-controlled oscillator (VCO) controlled by output of the low-pass filter; and An optional feedback divider that divides an output of the oscillator to provide the feedback signal.

When a phase-locked loop is locked, the divided reference and feedback signal remain in a constant relationship at the phase detector, when the loop is not locked the divided reference and feedback signal may slip past each other, such that the phase detector provides a varying output that, for some offsets of frequency and phase, tends to bring the oscillator to a frequency where the two will match.

Capture time is a time required, given a particular initial discrepancy between feedback signal and divided reference signal, to bring the divided reference and feedback signals into the stable relationship of lock. An issue with most phase-locked circuits is the capture time can be long, particularly when the divided reference and feedback signals are initially far apart. Further, when the low-pass filter has a low bandwidth, as is sometimes desirable to reduce phase noise in the oscillator output, the loop may fail to lock if the initial divided reference and feedback signal frequencies are too far apart. Long capture time is undesirable, particularly in such applications as frequency-hopping radios.

It is expected that if the feedback and divided reference frequencies are close to each other, and low-pass filter output that controls the oscillator is initialized to a value close to the value it will have during lock, and thus the oscillator frequency is initialized to a value close to a locked frequency, the capture time can be minimized.

SUMMARY

A phase locked loop system has a voltage-controlled variable-load ring oscillator (VLCO) that operates in a frequency band determined by a selected load on each stage of the ring oscillator. Each stage of the VLCO has multiple load selection transistors, each coupled to a load capacitor. Apparatus is provided for driving the load selection transistors according to a load configuration; and apparatus is provided for determining an operating load configuration such that a period of a divided reference signal approximately matches a period of a divided VLCO signal with the VLCO control voltage input clamped to a reference voltage. Once the load configuration is set, the loop is allowed to lock. In a particular embodiment, devices are provided for slowly tweaking the VLCO load to help keep the VLCO operating near an optimum control voltage despite drift of circuit parameters with temperature or time.

DETAILED DESCRIPTION OF THE EMBODIMENTS

Figure 1:
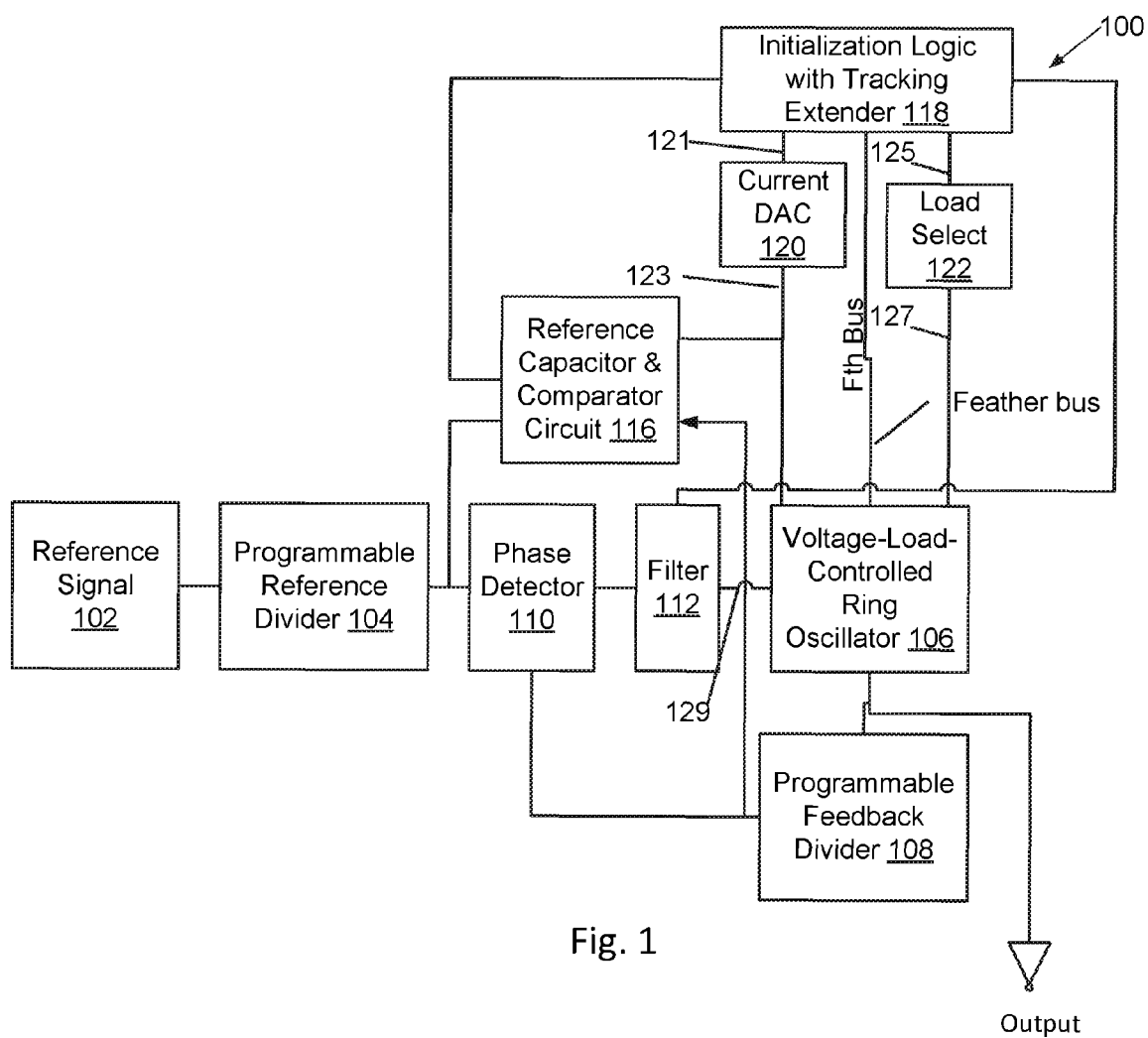
FIG. 1 is a block diagram of a phase locked loop embodiment.

A phase-locked loop subsystem 100 (FIG. 1) adapted to locking to a reference signal source 102 includes a programmable input reference divider 104 coupled to divide the reference signal 102, and a voltage-load-controlled oscillator (VLCO) 106, in an embodiment the VLCO is implemented as a ring oscillator. An output of VLCO 106 is divided by a programmable feedback divider 108, and a phase detector 110 is provided for determining phase differences between an output of feedback divider 108 and an output of the reference divider 104. During locked operation, an output of phase detector 110 is filtered by a low pass filter 112 and thence provided as a control signal to VLCO 106 such that the divided reference and divided feedback remain phase-locked.

Figure 2:
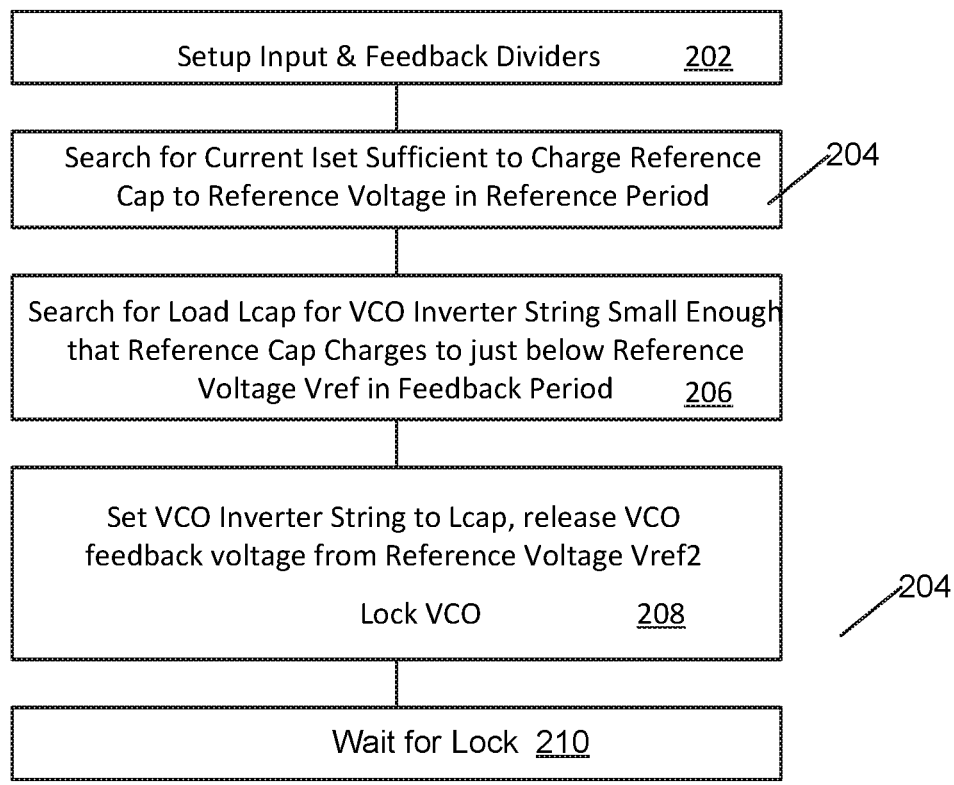
FIG. 2 is a flowchart of a method of initializing, locking, and allowing wide-range tracking of the phase-locked loop of FIG. 1.

Phase locked loops may experience phase jitter, or noise, that can be undesirable even if the loop is locked; reducing phase jitter typically requires that gain of the VLCO be low. A wide range for lock, however, typically requires that the gain from phase detector into VLCO be high. Apparatus, including a reference capacitor and comparator circuit 116, initialization logic 118, a current digital-to-analog converter (IDAC) 120, and a load selector 122 are provided in subsystem 100 to overcome these limitations—this apparatus is operated at startup of subsystem 100 according to the flowchart of FIG. 2 to rapidly lock the phase-locked loop to the reference signal 102.

Initialization and Locking of the Phase Locked Loop

During startup, both the feedback divider 108 and reference divider 104 are initialized 202. In an embodiment, both feedback divider 108 and reference divider have a final divide-by-two stage to provide a square-wave feedback divider output signal and a square-wave reference divider output signal.

Current Setting Phase

Figure 3:
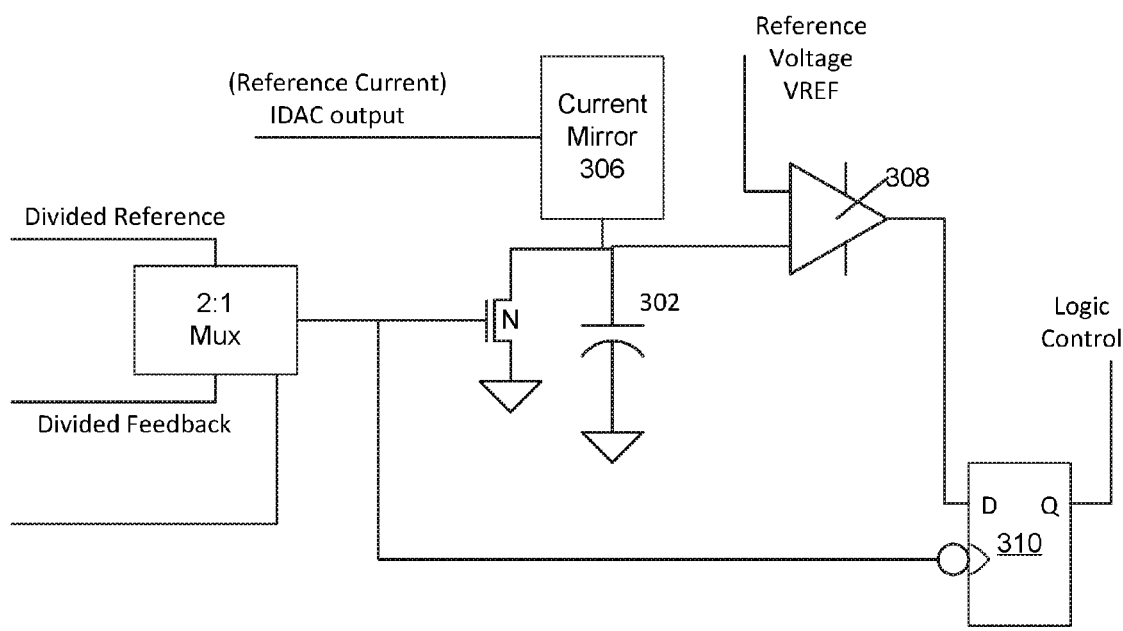
FIG. 3 is a schematic diagram of the reference capacitor and comparator circuit of the phase locked loop of FIG. 1
Figure 6:
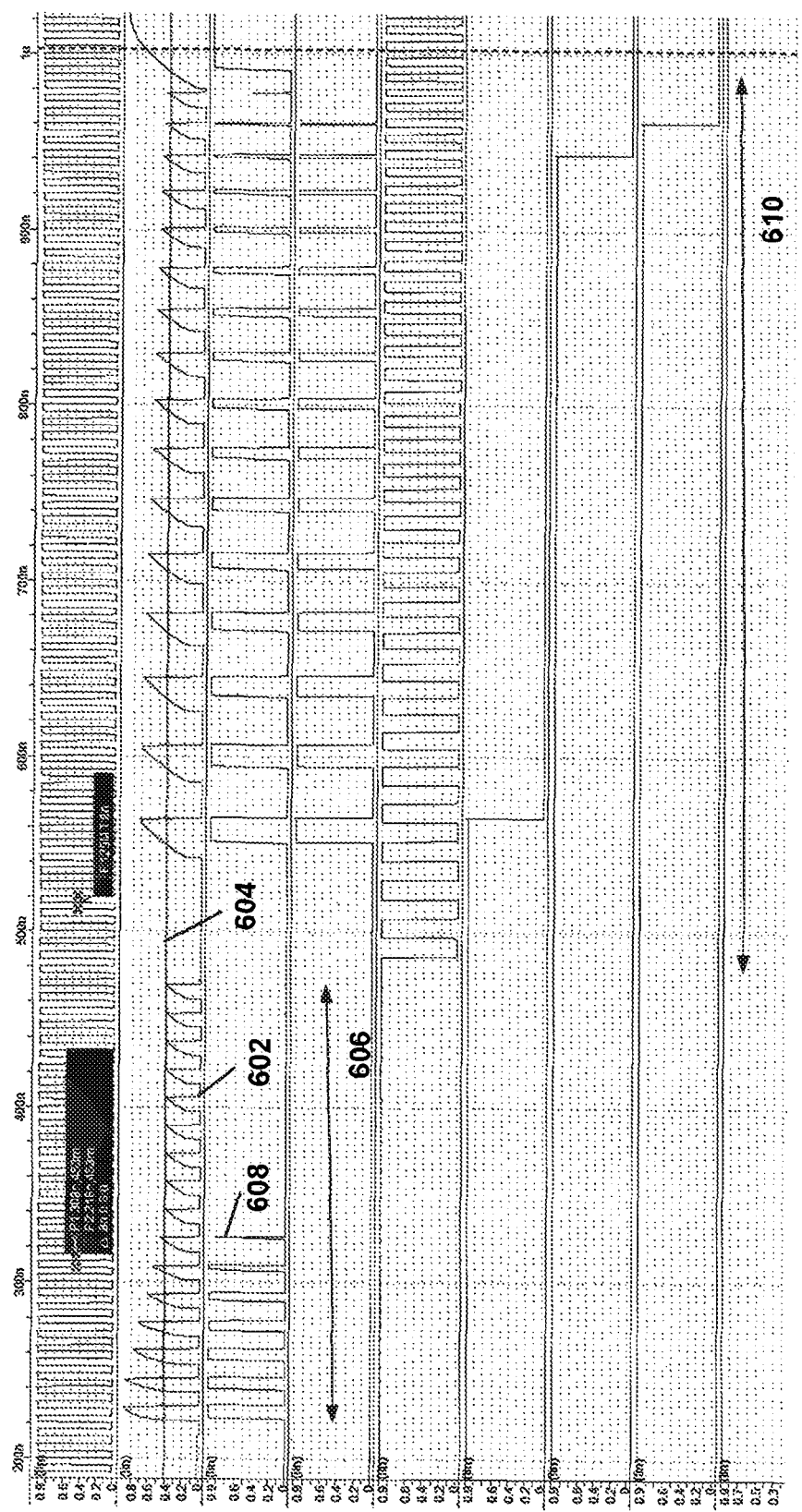
FIG. 6 is a waveform plot illustrating searching for current and searching for load.

Then, a reference capacitor 302 and comparator 308 circuit 116, in a circuit similar to that of FIG. 3, is used to search 204 for a current Iset on an edge of being sufficient to charge the capacitor to a reference voltage level Vref in a period of the reference divider 104 output. In embodiments, Iset is provided by a current digital-to-analog convertor 120. This search is performed during search interval 606 (FIG. 6). The reference capacitor is separate from any of the load capacitors of the VLCO chain. In an embodiment, search 204 is a linear search, in an alternative embodiment a successive-approximation or binary search is performed.

Searching 204 for the current Iset is performed in a particular embodiment by a straight linear search, a counter (not shown) in initialization logic 118 is decremented repeatedly until output 121 of the digital counter, transformed to a corresponding current 123 by IDAC 120, and mirrored by a mirror 306 to provide a charging current reference capacitor 302, provides a current that just fails to cause a voltage 602 (FIG. 6) on capacitor 302 to reach the reference voltage Vref 604 during the divided reference interval. The current is determined to be the greatest current that fails to sufficiently charge the capacitor as determined by comparator 308 and a digital sampling device 310; once digital sampling device 310 output 608 fails to indicate the voltage on capacitor 302 being greater than Vref, the counter stops decrementing. In an alternative embodiment, initialization logic 118 performs a binary search for an appropriate current. In alternative embodiments, a smallest current sufficient to charge the capacitor in the divided reference interval is found. The largest DAC current that fails to charge the capacitor in the divided reference interval, or the smallest DAC current that sufficiently charges the capacitor in the divided reference interval, are both referred to as a current "on the edge" of being sufficient to charge the capacitor in the divided reference interval.

Current mirror 306 is provided to isolate any long interconnect that may be present on IDAC 120 output. In an alternative embodiment, where IDAC 120 is located adjacent to capacitor 302, current mirror 306 is omitted and the IDAC 120 output is coupled directly to capacitor 302

Load Search Phase

Once the current Iset for the reference circuit is determined, a second, load-search, interval 610 begins. Load-search interval 610 searches for a load for the VLCO such that, with a midrange VLCO control voltage, a divided VLCO signal provides a period similar to that of the divided reference signal used during the current-setting phase.

During the load-search phase, the VLCO runs, with its control voltage set to a bias voltage Vbias2, and its output is divided by the feedback divider. In a particular embodiment Vbias2 is one-half of the power supply voltage and represents a midpoint of the effective dynamic range of the VLCO control voltage. VLCO current is set independently of the current determined for the reference circuit.

In a particular embodiment, searching for the VLCO load is performed as a linear search from large load to small load. Load capacitors of the VLCO are successively removed from stages of the VLCO until an approximate match of a period of the feedback divider output is found to the period of the divided reference divider output. As shown above, the divided reference divider output period is the time it takes for the determined reference current to be a current "on the edge" of charging the reference capacitor to the reference voltage Vref. Again, a counter (not shown) having counter output 125 of initialization logic 118 is decremented. An output 125 of the counter is decoded by load selection circuitry 122, load selection 122 circuitry provides multiple oscillator load enable signals 127 to the VLCO that determine which load capacitors are in use, and which load capacitors are disabled, in the VLCO ring oscillator. As the counter decrements, capacitors of VLCO ring-oscillator stages are disabled thereby allowing oscillation at higher frequencies.

Figure 4:
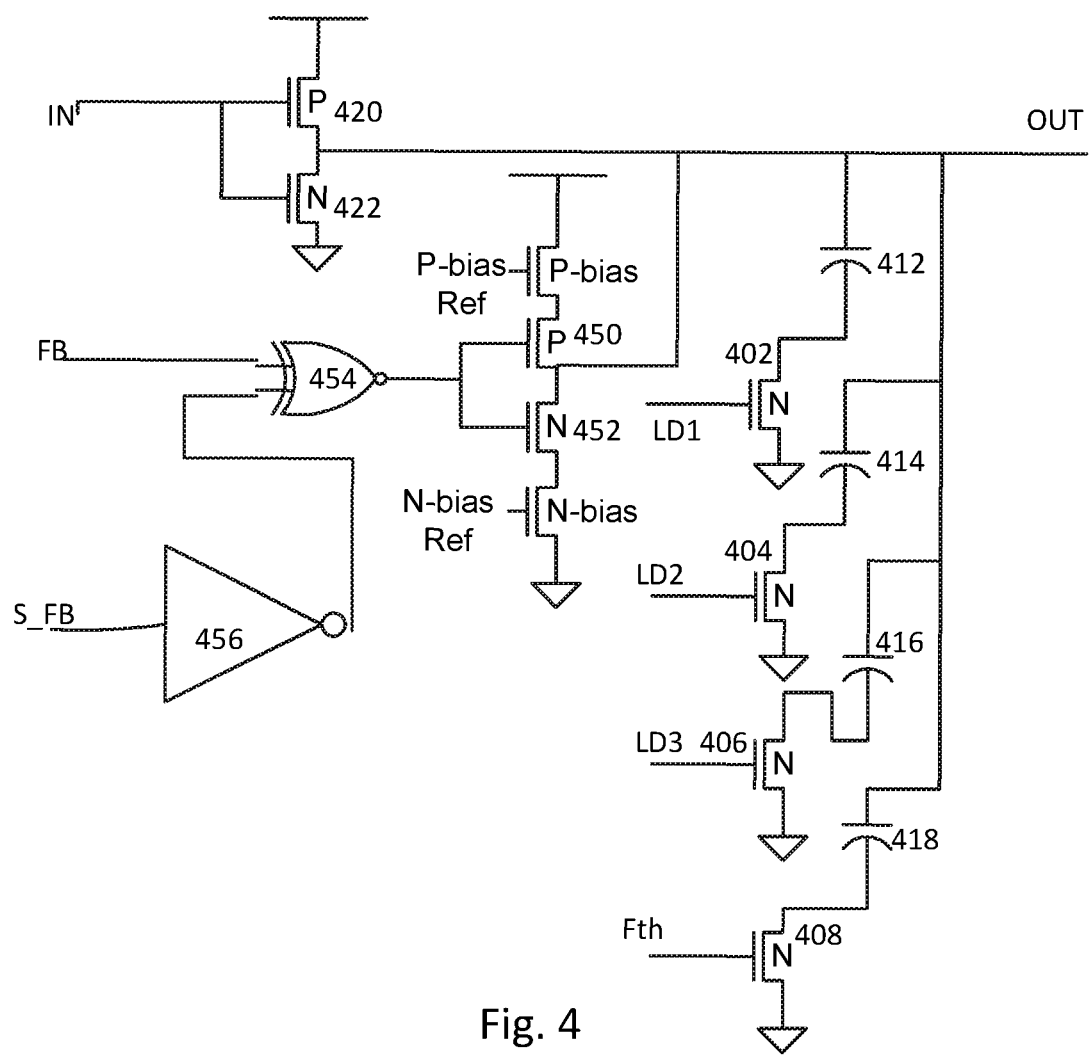
FIG. 4 is a schematic diagram of an inverter stage "INV3" of the ring oscillator of FIGS. 1 and 5.

An individual inversion stage of the VLCO is illustrated in FIG. 4, the stage acts to invert an input IN to provide an inverted output OUT, with a delay. Each such stage has three, or in alternative embodiments more than three, load-enable signal inputs LD1, LD2, LD3, which are among load enable signals 127. When each load-enable signal is high, that signal turns on a transistor, such as transistors 402, 404, 406, thereby causing capacitors, such as capacitors 412, 414, 416, coupled in series with the transistors to become part of a total capacitive load on output OUT, as driven by transistors 420, 422, and thereby slowing down transitions on output OUT. With the counter counting down, the load selection circuitry acts to turn off loads in a pattern and sequence that gradually and linearly decreases a total propagation delay across all five, or in an alternative embodiment seven, inversion stages of the VLCO. This decrease in delay thereby causes an operating frequency of VLCO to increase, and successive periods of the feedback divider output get shorter. In embodiments, capacitors 412, 414, 416 are not all the same size, and capacitors 412, 414 may have a 2:1 size relationship. Further, not all stages of the VLCO need have the same size capacitors.

During successive cycles of the divided feedback divider output, the same Iset current determined during the current setting phase is allowed to charge the reference capacitor 302 (FIG. 3) for a period of the feedback divider output. If a voltage on the capacitor passes the reference voltage Vref during an interval determined by dividing the VLCO output, as determined by comparator 308 and sampling circuit 310, the counter in the initialization logic is decremented, while if the capacitor voltage fails to pass Vref, the counter is not decremented, and a third phase, or locking phase 208 (FIG. 2), of operation may begin.

An optional small offset Voffs1 may be applied to the comparator during either the Current Selection phase or the Load Selection phase to better optimize performance.

Since open-loop VLCO frequency depends on the selected load capacitors in use as determined by counter output 125, with each possible counter output associated with a frequency band of possible VLCO operation. Counter output 125 at the end of the load selection phase selects an operating frequency range of the VLCO such that the divided VLCO signal approximately matches the divided reference signal, and that a VLCO control voltage at lock will be within the dynamic range of the VLCO even if the VLCO has low gain.

Locking Phase

The locking phase 208 begins by setting the control voltage of the VLCO to the reference voltage Vbias2 to which it was clamped during the Load Search Phase, and in some embodiments to Vbias2 plus or minus a small predetermined offset voltage Vofs2, while using the load determined above during the Load-Search Phase. This control voltage is then released and allowed to change according to phase detector 110 and lowpass filter 112; the phase-locked loop is allowed to run and it should then lock, settling on a control voltage such that frequencies of the divided reference signal and divided VLCO signals are equal. In embodiments, the offset voltage Vofs2 is applied during the Load Search Phase, and no offset is used during the initial setting of the VLCO during Locking Phase. The offset voltage Vofs, when used, is selected to optimize lock time within each VLCO frequency operating band.

Extended Tracking

A low-gain VCO (VLCO) not only can provide low phase jitter, but can result in feedback control voltage at the VCO reaching voltage excursion limits as circuit parameters change with temperature, or when it is desired to track a widely-changing frequency of the reference signal. Since VCO control voltage exceeding or reaching voltage excursion limits can break lock, this is undesirable.

Each inverter stage of VLCO 106 has an additional, small, trim capacitor 418 (FIG. 4) and Fth-bus-line switching transistor 408 that enables or disables this trim capacitor 418.

Figure 7:
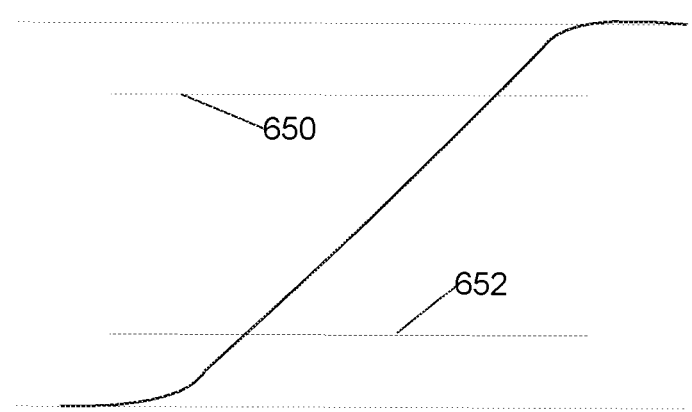
FIG. 7 illustrates upper and lower thresholds and signal swing limits of VCO oscillator feedback voltage for feather (Fth)-bus switching.
Figure 5:
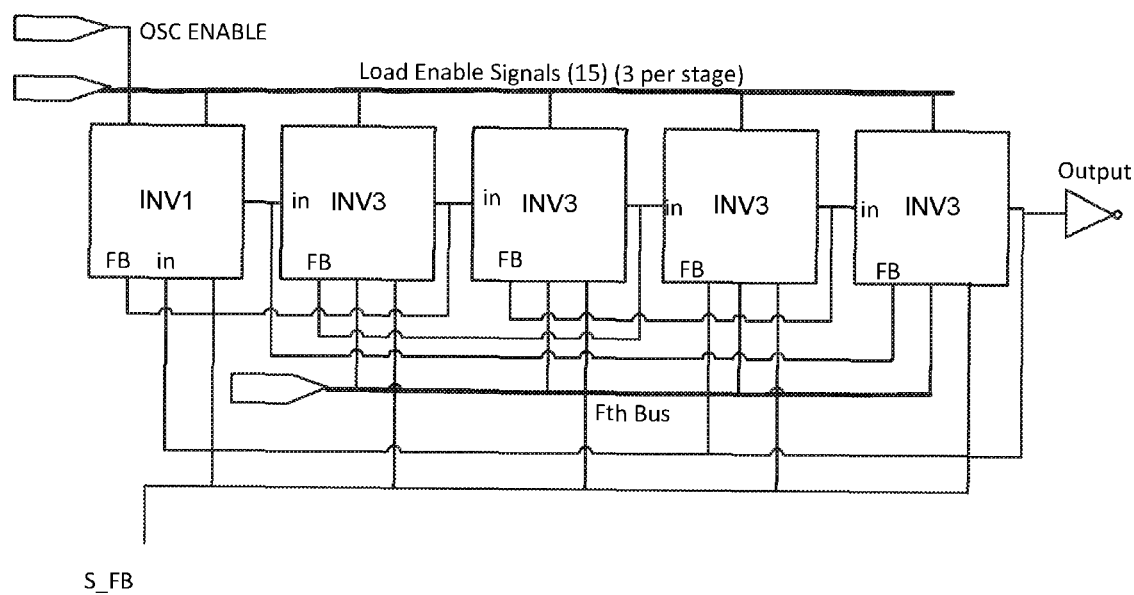
FIG. 5 is a schematic diagram of the ring oscillator of FIG. 1.

Of the 5 stages of the ring oscillator VLCO, two stages are held with transistors 408 turned off, and two are held with transistors 408 turned on during search for load. Once the correct load has been found and the loop locked, the VLCO oscillator feedback voltage 129 produced by the filter 112 (FIG. 1) is continuously compared to an upper threshold 650 and a lower threshold 652 (FIG. 7) voltage, these upper and lower threshold voltages are within the dynamic range of VLCO feedback control voltage 129. In order to prevent saturation of the VLCO oscillator feedback voltage 129, whenever the feedback voltage exceeds the upper threshold, the Fth bus transitions to subtract one Fth-bus trim capacitor 418 load from the oscillator and speeds up the ring oscillator, allowing a reduced feedback voltage and helping to keep the feedback voltage 129 within, and near center of, its allowable dynamic range. Similarly, whenever the feedback voltage drops below the lower threshold, the Fth bus transitions to add one Fth-bus trim capacitor to the oscillator and thereby slow down the ring oscillator, allowing an increased feedback voltage that lies closer to the center of VLCO control voltage range.

Note, however, that a sudden, sharp, transition of the Fth bus is undesirable because such a transition would cause significant phase noise on the VLCO control voltage as the PLL tries to maintain lock. Signal transitions on the Fth bus are therefore made quite slowly, or in a particular embodiment low-pass filtered, to slow transitions at the Fth-bus-line transistor 408 (FIG. 4) of each oscillator stage. Simulations and our logical expectations show that slow transitions of each Fth-bus line permit these signals to pass through intermediate states where, rather than the entire associated load 418 acting to slow the oscillator stage, or none of load 418 acting to slow the oscillator stage, load 418 effectively acts in part of each cycle and slows the stage by an intermediate amount. The net effect of these slow transitions of the Fth bus is that the oscillator's effective frequency range changes slowly enough to prevent significant phase noise on the VLCO control voltage during Fth bus switching.

The net effect of adjusting load through the Fth bus is to extend tracking range of the VLCO beyond the range that would be supported without the Fth bus mechanism and similar low VLCO gain. The extended tracking range granted by the Fth-bus mechanism also allows for the VLCO to maintain lock over wide temperature ranges where the normal dependencies of integrated circuits might otherwise cause VLCO operating frequency to drift beyond the range at which lock can be maintained.

Feedforward and Feedback

In addition to the above described features, each oscillator stage (FIG. 4) has a second inverter (transistors 450, 452), that is significantly weaker than its primary inverter (transistors 420, 422), second inverter has an input derived through an XOR gate 454 from FB, FB is an output of a stage of the ring oscillator different from the input signal of that ring oscillator stage, and in an embodiment is an output of a stage further along the ring oscillator.

With a control signal S_FB set at a high value, this second inverter acts to effectively add hysteresis to each stage of the oscillator by opposing its transition until not only has it switched, but so has the following stage, at which point it assists in its transition. With this control signal high, the second inverter acts as a voltage-variable slowdown circuit, with the amount of slowdown it provides controlled through transistors P-Bias and N-Bias that set a level of feedback bias current, according to reference voltages P-Bias Ref, and N-Bias Ref. Switching devices 450, 452 gate current from P-Bias or N-Bias onto the stage output, where it tends to assist the primary pull-up 420 and pull down 422 devices in each transition.

In an alternative embodiment, with the control signal S_FB at a low value, the second inverter of 450, 452 acts as a speedup circuit similar to that described in U.S. Pat. No. 6,384,654. The voltage-variable delay stages use a feedforward path from an earlier stage in the oscillator chain coupled in parallel with the primary pull-up 420 and pull-down 422 devices of the delay stage, to provide faster and more consistent minimum propagation delays than achieved with voltage-variable delay stages of conventional design.

With reference to FIG. 4, transistors P-Bias and N-Bias set a level of feedforward bias current, according to reference voltages P-Bias Ref, and N-Bias Ref. Switching devices 450, 452 gate current from P-Bias or N-Bias onto the stage output, where it tends to assist the primary pull-up 420 and pull-down 422 devices in each transition.

With feedforward devices as per the invention, the voltage-variable delay stages can be thought of as operating in an auxiliary voltage-variable speedup mode, as opposed to the usual voltage-variable slowdown mode.

Feedforward devices similar to those of the voltage-variable delay stages have also been found useful for high speed logic gates, including ripple-carry chains.

The voltage-variable feedforward devices P-Bias, N-Bias 450, and 452, may be disabled for low current leakage testing and for low-speed operations by pulling the current control signals P-Bias Ref, and N-Bias Ref to high and low voltage rails, respectively. Configuration of the S_FB, P-Bias Ref, and N-Bias Ref signals is done prior to configuring the Load-Enable signals and Fth Bus, as necessary for a particular application of the PLL; they are typically not changed during run-time of the circuit.

CONCLUSION

Changes may be made in the above methods and systems without departing from the scope hereof. It should thus be noted that the matter contained in the above description or shown in the accompanying drawings should be interpreted as illustrative and not in a limiting sense. In particular, the selectable feedforward or feedback circuit involving signals S_FB, P-Bias Ref, and N-Bias Ref, may be used with or without the variable load selection circuits and the Fth Bus feather control circuit. The following claims are intended to cover all generic and specific features described herein, as well as all statements of the scope of the present method and system, which, as a matter of language, might be said to fall therebetween.

What is claimed is:

1. A phase locked loop system comprising:
a reference source coupled to a phase detector;
a ring oscillator, the ring oscillator comprising a plurality of stages, each stage further comprising a plurality of load selection transistors each coupled to a load capacitor, and an inverter;
apparatus adapted to driving the load selection transistors according to a load configuration;
apparatus adapted to determining an operating load configuration for the configuration; and
a feedback divider coupled to divide an output of the ring oscillator and provide a feedback divider output signal to the phase detector;
wherein the apparatus adapted to determining a load configuration further comprises a reference capacitor, and circuitry configured to determine a current selected from a current just sufficient to charge the reference capacitor to a particular value in a time determined by the reference source, and a current just insufficient to charge the reference capacitor to a particular value in a time determined by the reference source.

2. The phase locked loop system of claim 1 wherein the apparatus adapted to determining a load configuration further comprises circuitry configured to set the load configuration to a sequence of configurations, and to determine if the reference capacitor is charged to the particular value in a time determined by the feedback divider output signal for each configuration of the sequence of configurations.

3. The phase locked loop system of claim 2 wherein the sequence of configurations is a linear search.

4. The phase locked loop system of claim 2 wherein the sequence of configurations is a binary search sequence.

5. A method of locking a phase-locked loop comprising:
providing a divided reference frequency;
providing a reference capacitor;
searching for a reference current selected from the group consisting of a current just sufficient to charge the reference capacitor to a particular value in a time determined by the divided reference frequency, and a current just insufficient to charge the reference capacitor to a particular value in a time determined by the divided reference frequency;
operating a voltage-controlled oscillator (VCO) having a plurality of VCO frequency ranges;
selecting a VCO frequency range such that the reference current charges the reference capacitor to a particular value in a period determined by a count of the VCO;
coupling the VCO through a counter to a phase detector, the divided reference to the phase detector, and a phase detector output to control the VCO, thereby closing the phase locked loop;
allowing the phase locked loop to lock.

6. The method of claim 5 wherein the VCO is a voltage-load-controlled oscillator (VLCO), the VLCO is a ring oscillator, and the VCO frequency ranges are determined by configurable capacitive loads on stages of the VLCO ring oscillator.

7. The method of claim 6 wherein selecting a VCO frequency range such that the reference current charges the reference capacitor to a particular value in a period determined by a count of the VCO is performed by trying load configurations of the configurable capacitive loads of the VLCO according to a sequence of configurations.

8. The method of claim 7 wherein the sequence of configurations is a linear search.

9. The method of claim 7 wherein the sequence of configurations is a binary search sequence.

10. The method of claim 6 wherein selecting a VCO frequency range is performed by finding a load configuration for the VLCO such that, with a midrange VLCO control voltage, a divided VLCO signal provides a period similar to that of the divided reference signal used during the current-setting phase.

* * * * *